United States Patent [19]

Addie et al.

[11] Patent Number: 4,498,096
[45] Date of Patent: Feb. 5, 1985

[54] BUTTON RECTIFIER PACKAGE FOR NON-PLANAR DIE

[75] Inventors: David L. Addie, Chandler; Kenneth A. Ellsworth, Gilbert, both of Ariz.

[73] Assignee: Motorola, Inc., Schaumburg, Ill.

[21] Appl. No.: 531,622

[22] Filed: Sep. 12, 1983

Related U.S. Application Data

[63] Continuation of Ser. No. 229,696, Jan. 30, 1981, abandoned.

[51] Int. Cl.³ .................... H01L 23/48; H01L 29/34; H01L 29/48
[52] U.S. Cl. ........................................ 357/67; 357/15; 357/52; 357/65; 357/68; 29/589
[58] Field of Search .............. 357/15, 65, 67, 68, 357/75, 81, 52; 29/589; 228/123

[56] References Cited

U.S. PATENT DOCUMENTS

| 3,257,272 | 3/1966 | Kallander | 357/52 |
| 3,290,127 | 12/1966 | Kahng et al. | 357/65 |
| 3,339,274 | 9/1967 | Saia et al. | 357/52 |
| 3,354,258 | 11/1967 | Saia et al. | 357/65 |
| 3,665,254 | 5/1972 | Collard et al. | 357/15 |
| 3,839,727 | 10/1974 | Herdzik et al. | 228/123 X |
| 3,871,014 | 3/1975 | King et al. | 357/65 |
| 4,005,454 | 1/1977 | Froloff et al. | 357/67 |
| 4,020,987 | 5/1977 | Hascoe | 228/123 |
| 4,119,446 | 10/1978 | Mastroianni | 357/15 |
| 4,171,528 | 10/1979 | Kling | 357/68 |

FOREIGN PATENT DOCUMENTS 9131  3/1980  European Pat. Off. ............ 228/123

OTHER PUBLICATIONS

Ahn et al., "Permalloy Solder Barrier for Devices with Gold Metallization", *IBM Tech. Discl. Bull.*, vol. 20, No. 12, p. 5317, May 1978.

Calhoun, Casowitz et al. "Structures for Protecting Schottky Barrier Diodes from Premature Breakdowns Under Reverse Voltage Conditions", *IBM Technical Disclosure Bulletin*, vol. 18, No. 6, Nov. 1975, pp. 1847–1848.

Rusu, Bulucea et al. "The Metal-Overlap, Laterally Diffused (MOLD) Schottky Diode", *Solid State Electronics*, vol. 20 (1977), pp. 499–506.

*Primary Examiner*—Andrew J. James
*Assistant Examiner*—John Lamont
*Attorney, Agent, or Firm*—Robert M. Handy

[57] ABSTRACT

An axial lead semiconductor device package is provided for use with non-planar semiconductor die. By using solders of predetermined strength, wetting and flow characteristics, melting temperature, shape, area, and thickness, reliable attachment of non-planar die to planar mounting surfaces is achieved.

9 Claims, 3 Drawing Figures

BUTTON RECTIFIER PACKAGE FOR NON-PLANAR DIE

This is a continuation of application Ser. No. 229,696, filed Jan. 30, 1981, now abandoned.

BACKGROUND OF THE INVENTION

This invention relates to a package for semiconductor diodes and, in particular, to button diodes in which the semiconductor die has a non-planar surface.

The button diode is a particularly useful package configuration for semiconductor rectifiers and has achieved widespread commercial use. An example of this type of package is disclosed in U.S. Pat. No. 4,093,958. The improved, low-cost package described therein comprises a semiconductor diode chip or die soldered between two contact members, hereinafter called studs, having good thermal conductivity. The studs have a cross-section slightly larger than the semiconductor die. A planar face on each stud is soldered, respectively, to the planar and substantially parallel faces of the chip. The diode chip and the ends of the stud to which it is soldered are surrounded with a suitable encapsulant which protects the chip and insulates the studs from each other. Because the major faces of the semiconductor chip are planar, the solder provides substantially uniform contact between the stud and semiconductor device across the whole area of the semiconductor die irrespective of its shape, whether round, square, or rectangular.

There are a number of semiconductor devices, Schottky rectifiers for example, wherein at least one of the major faces is not planar, even though they may be referred to as using planar passivation techniques. In these devices there is typically present on the surface of the semiconductor die a protruding passivation region (typically a dielectric oxide or equivalent) surrounding the junction periphery, often in the shape of an annular ring near the edges of the chip. Thus, the surface of the semiconductor to be contacted is in the bottom of a moat whose sidewalls are formed by the passivation region. This type of depressed surface is not readily contacted by a planar stud. Thus, in the prior art, the stud is provided with a boss or raised portion on the surface to be mated to the semiconductor chip. Since the studs have cylindrical symmetry, the boss usually also has cylindrical symmetry. Alternatively, a separate disk may substitute for the boss and be soldered to the stud at the same time as the die is attached.

The circular boss or disk of the prior art provides a poor match to the rectangular semiconductor die typically utilized. The circular boss contacts less than 80% of available contact area on a rectangular chip which, in turn, increases the series resistance, and degrades the power handling capabilities of the device. Thus, a need continues to exist for a button diode design which overcomes the difficulties described above inherent in the use of non-planar die.

Accordingly, it is an object of the present invention to provide an improved package for semiconductor power diodes with non-planar surfaces.

A further object of the present invention is to provide an improved package for semiconductor diodes with rectangular non-planar die.

Another object of this invention is to make possible the use of identical stud members for assembly to both planar and non-planar surfaces of a die.

A further object of the present invention is to provide improved transient response for semiconductor packages using non-planar rectangular die.

It is an additional object of the present invention to provide a process whereby an improved package for semiconductor diodes using non-planar die may be assembled.

SUMMARY OF THE INVENTION

The foregoing objects are achieved in the present invention wherein it has been found that solder of the appropriate strength, wetting and flow characteristics, melting temperature, shape, area and thickness will fill the moat present on the non-planar semiconductor die and reliably attach a non-planar die to a stud having a planar mounting face. By solder-filling the moat, metallic contact can be maintained between all portions of the die contact area and the planar stud mounting face so as to improve both thermal and electrical behavior of the device.

BRIEF DESCRIPTION OF THE DRAWINGS

A more complete understanding of the present invention can be obtained by considering the following detailed description in conjunction with the accompanying drawings in which.

DETAILED DESCRIPTION OF THE PREFERRED EMBODIMENTS

Figure 1:
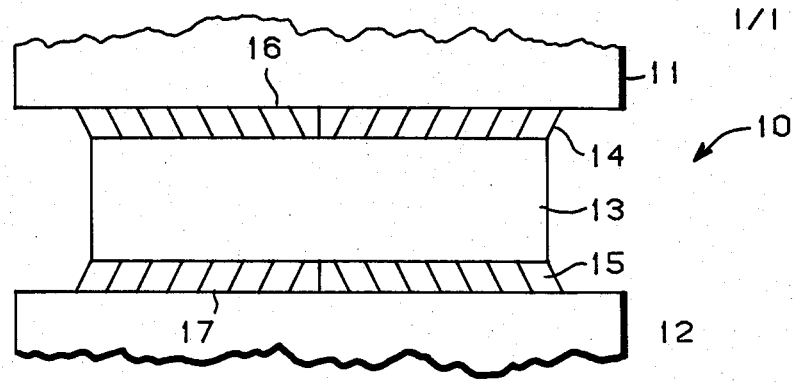
FIG. 1 illustrates a cross-section of a package of the prior art for a rectangular planar chip, taken through the principal diagonal of the chip.

FIG. 1 shows semiconductor diode package 10 of the prior art wherein studs 11 and 12 having planar faces 16 and 17 are attached by solder regions 14 and 15 to rectangular semiconductor chip 13. In this example, semiconductor chip 13 has planar faces which may be readily attached by soldering to the planar faces of the studs. The studs are ordinarily cylindrically symmetric with respect to a line perpendicular to planar faces 16 and 17. Semiconductor die 13 may be of any shape so long as it fits within the perimeter of studs 11 and 12. Studs 11, 12 are normally identical in shape which is a significant manufacturing convenience.

Figure 2:
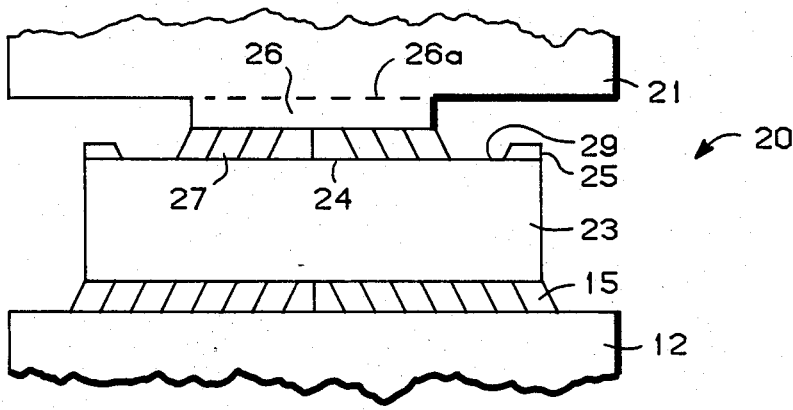
FIG. 2 illustrates a cross-section of a package of the prior art for a rectangular non-planar chip taken through the principal diagonal of the chip.

FIG. 2 shows semiconductor diode package 20 of the prior art for use with non-planar rectangular semiconductor chip 23. As in FIG. 1, cylindrically symmetric stud 12 is soldered at 15 to semiconductor chip 23. Stud 21 of FIG. 2 has circular boss 26 which must fit within moat region 24–25 defined by ring shaped surface passivation region 25 and die contact surface 24. Solder 27 attaches stud 21 to semiconductor chip 23 via boss 26. FIG. 2 shows the approximate relationship of circular boss 26 lying within rectangular passivation region 25 so that non-contacted portion 29 of die contact surface 24 is readily apparent. Studs 21 and 22 are no longer identical, thus increasing the manufacturing cost and reducing the yield.

Prior art attempts to overcome the deficiencies of the design of FIG. 2 include use of a small disk in place of boss 26 with additional solder joint 26a, and use of a rectangular boss or a rectangular insert to better match the shape of moat region 24–25. These approaches, however, are more costly and creates severe manufacturing problems, as for example, the rotational alignment of a rectangular insert or boss within a rectangular moat.

Figure 3:
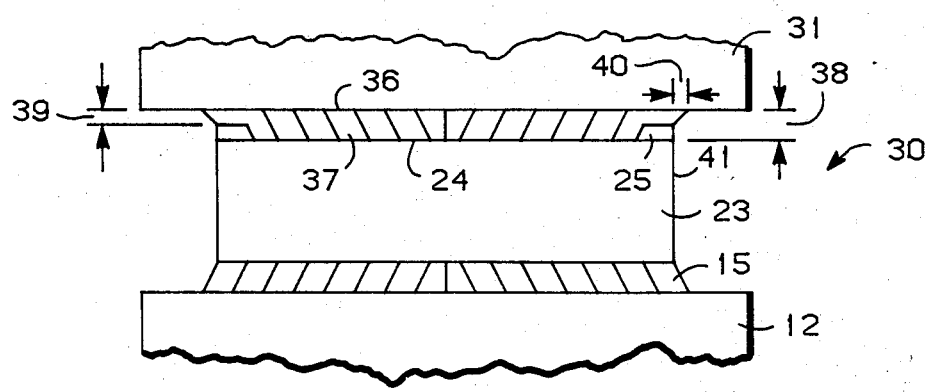
FIG. 3 illustrates a cross-section of a package in accordance with the present invention utilizing a rectangular non-planar chip, taken through the principal diagonal of the chip.

In accordance with the present invention, as illustrated in FIG. 3, cylindrically symmetric stud 31 of semiconductor diode package 30 is attached directly to semiconductor die 23 by solder region 37 which substantially fills moat region 24–25 and extends above passivation region 25 by predetermined distance 39 to give total solder thickness 38 measured between die contact surface 24 and planar stud surface 36. Solder 37 can extend beyond the perimeter of die 23 by a small amount 40, so long as shorts do not occur over the edge of the die onto edge 41 or to stud 12. As in the prior art, stud 12 is attached to semiconductor die 23 by solder joint 15. Studs 31 and 12 are substantially identical which is a desirable manufacturing convenience.

Die 23 may comprise any suitable shape. For example, where cost considerations are paramount, a square die can be used. Where performance is paramount, a circular die slightly smaller in area than the studs can be used. Unlike most prior art devices for non-planar die, contact is made to the total exposed surface contact area 24 of semiconductor chip 23, irrespective of its shape.

As a specific example of a device built in accordance with the present invention, a 160 mil (4.1 mm) square, oxide passivated, platinum-silicide Schottky diode was soldered between electrodeless nickel plated copper studs of cylindrical form, each weighing 0.724 gm and having a 260 mil (6.6 mm) planar mounting face, utilizing a round solder preform of 125 mils (3.2 mm) diameter and 2.75 mils (0.069 mm) thick by heating the assembled parts in a controlled atmosphere furnace using hydrogen gas to a peak temperature of 372°–385° C. During assembly, upper stud 31 floats on molten solder puddle 37 whose area corresponds approximately to the die area plus small amount 40.

Lead-tin solders in the composition range Pb (90%)/Sn (10%) to Pb (100%)/Sn (0%) are useful with Pb (95%)/Sn (5%) being preferred. The latter solder has a solidus-liquidus range of 306°–314° C. and yield strength of 3400 psi (23 MPa). The solder completely fills moat 24–25 which is typically 0.04 mil, or (0.0001 mm) deep, and extends above passivation region 25 by distance 39 of approximately 1.7 mils (0.04mm). It was found that square die having lateral dimensions in the range 140–170 mils (3.6–4.3 mm) could be successfully assembled to the studs using a 125 mil (3.2 mm)×2.75 mil (0.07 mm) round preform of the above described solder. Conversely 120 mil (3.0 mm) square die could not be successfully assembled using 65×2.75 mil (1.7×0.07 mm) round preforms due to excessive solder shorting at the periphery of the die.

Several other solder compositions were tried and found to be unsatisfactory, for example, Pb (92.5%)/In (5%)/Ag (2.5%) with a melting point of 307° C. and yield strength of 4560 psi (31.4 MPa); Au (88%)/Ge (12%) with a melting point of 356° C. and yield strength exceeding 7000 psi (48.2 MPa), and Au (80%)/Sn (20%) with melting point of 280° C. and yield strength also exceeding 7000 psi (48.2 MPa). With these solders, die cracking and separation occurred.

As a result of these and other tests, a set of criteria for the selection of the proper combination of solder composition, shape, size, temperature behavior, surface tension forces, flow, and wetting properties relative to the contact members (studs) and die were determined as follows.

A first solder used to attach a die to studs or contact members must have a remelt temperature, that is, the temperature at which remelting occurs upon reheating a soldered device, which is greater than a second soldering temperature which will be employed by the user to mount the finished device. The minimum melt temperature of the first solder is chosen to be a few degrees above the minimum allowable remelt temperature, plus a safety margin. Typical values for these three temperatures are; a second soldering temperature of not more than about 250° C., a minimum first solder remelt temperature of 260°–270° C., and a minimum first solder melt temperature of 270°–280° C. This combination gives satisfactory results.

The maximum furnace temperature utilized must exceed the liquidus point, be below the point of destructive alloying with the silicon, and also be such that the solder does not become so fluid or the surface tension so low that it runs onto the stud surface significantly beyond the die perimeter and causes shorts. The maximum furnace temperature may be conveniently determined by experiment.

The solder shape, volume and surface tension, the stud weight and the die area must satisfy the following related criteria. The surface tension of solder is normally so high that if the molten solder is placed freely on the die it tends to form an oblate sphere. As the molten solder wets the die it spreads laterally and flattens, resembling an oblate hemisphere. A stud resting on the solder further compresses and spreads the molten puddle until the surface tension forces in the sidewall of the puddle balance the weight of the stud. If excessive weight or pressure is applied, the puddle effectively collapses so that the stud rests directly on passivation ring 25, the excess solder being squeezed beyond the chip periphery. Units made in this way fail due to peripheral shorts and die cracking.

It has been found for the preferred Pb (95%)/Sn (5%) solder and maximum furnace temperature of 385° C., that surface pressures of 430–490 Pa on the molten solder due to the weight of a stud are acceptable and that 755–785 Pa are excessive. Surface tension may be altered within limits set by other constraints by varying solder composition and temperature to accommodate different stud weights and die sizes.

The correct solder wetting characteristics must also be considered. The solder must wet sufficiently well to insure a substantially void free bond to the contact surface of the die and the mating surface of the stud, but not so well as to flow across the stud surface and run out significantly beyond the die perimeter. The solder can extend for a small distance beyond the die perimeter on stud 31 as shown at 40 of FIG. 3, so long as it does not wet edge 41 of die 23 and cause shorts, or bridge the die and short to stud 12. Maintaining a solder puddle of the currect size and shape between the stud and the die is necessary. Pb (95%)/Sn (5%) solder provides the desired wetting characteristics on platinum-silicide and nickel plated copper contact surfaces, but not on gold or copper surfaces. Other solder combinations for other contact surfaces are readily determined by experiment.

Solder is conveniently provided for the soldering operation as a preform, that is, a thin solder sheet cut to the appropriate size and shape and placed between the die and the studs prior to insertion in a soldering furnace. A simple alignment fixture holds the pieces in a stacked relationship. Since solder wetting is desired to be limited substantially to an area within or approximately coincident with the chip perimeter plus small extension 40, it is desired to use a solder preform smaller than the die and preferably able to fit within moat 24–25. A solder preform area 45–55% of the die area is a convenient value. The preform is aligned to lie within the chip boundary prior to soldering. The thickness of the preform is adjusted to give a solder volume sufficient to fill the moat and give a predetermined additional thickness 39. Satisfactory values for total solder thickness 38 have been found experimentally to be from approximately 0.5 mil (0.013 mm) to approximately 3 mils (0.076 mm) with 1.0 to 2.0 mils (0.025–0.051 mm) being a preferred range. Beyond approximately 3 mils (0.076 mm), excess solder runs out beyond the die perimeter and edge shorting occurs. Below 0.5 mil (0.013 mm) die cracking is increasingly troublesome.

Structural Constraints

The area of the frozen solder should preferably cover the contact area within the moat. The maximum area is limited to approximately the chip area, the determining requirement being to avoid edge shorts at the die periphery.

The differential thermal expansion and contraction of the stud and the semiconductor die create large shear forces which, unless relieved, can fracture the relatively brittle semiconductor die or the interfaces with the solder. The thickness of the frozen solder must be sufficient to fill the moat plus provide a stress relief cushion whose thickness 38 must be in the range of approximately 0.5–3 mils (0.013–0.076 mm) preferably 1.0–2.0 mils (0.025–0.051 mm).

Additionally, the solder must be chosen from the class of materials whose yield strength is less than that of the semiconductor die or interfaces, but larger than the value corresponding to the minimum pull strength, e.g. 1250 psi or 8.6 MPa, which the finished device must withstand. Materials having yield strength of 3400 psi (23.4 MPa) have been found to be acceptable. They allow the solder to undergo plastic flow to relieve stress without damage to the device. Solder materials with yield strength equal to or greater than 4560–7000 psi (31–48 MPa) produced excessive breakage. This is an unexpected result, since from the known breaking strength of single crystal silicon (25,000–60,000 psi; 172–413 MPa) one would not expect solders with yield strength as low as 4560–7000 psi (31–48 MPa) to produce breakage.

In the prior art devices the thermal impedance between the junction and an external heat sink is different for the upper and lower studs because of the presence of boss 26 in FIG. 2, this difference typically being in the range of 20–40%. Thus, removal of heat from the prior art device of FIG. 2 is impaired. The thermal impedance of the invented device structure of FIG. 3 is substantially symmetrical, and superior to that of the prior art device. Thus the transient response of the device is improved.

Assembly is facilitated with structures in accordance with the present invention. Since the studs are identical, no additional piece parts are required and no special alignment is needed. This results in lower manufacturing cost and higher yield.

Having thus described the invention it will be apparent to those of skill in the art that various modifications can be made within the spirit and scope of the present invention as for example, changes in the size and shape of the contact members (studs), changes in the chemical composition of the contact surfaces, changes in the shape and height of the oxide (dielectric) passivation region, and changes in solder composition, so long as the resultant satisfies the enumerated criteria. Hence, it is intended that all such modifications be included.

We claim:

1. An axial lead semiconductor device comprising:
   first and second leads having, respectively, substantially planar first and second contact members;
   a semiconductor die having first and second faces, with a raised dielectric region of a predetermined height on at least said first face;
   solder means having a tensile strength less than 4560 psi (31 MPa) substantially uniformly interconnecting said first face and said substantially planar first contact member;
   wherein said solder means extends over a portion of said raised dielectric region and has on said raised dielectric region a first thickness;
   wherein said solder means has a second thickness measured between said first face and said first contact member which exceeds said predetermined height of said raised dielectric region by an amount equal to said first thickness; and
   attachment means interconnecting said second face and said substantially planar second contact member.

2. The device of claim 1 wherein said raised dielectric region comprises an annular ring forming a moat region on said first face of said semiconductor die, wherein said solder means substantially uniformly contacts that portion of said first face of said semiconductor die lying within said annular ring, and wherein said solder means substantially fills and extends above said moat region and over at least a portion of said annular ring without contacting portions of said semiconductor die laterally outside said ring, and wherein said solder means has a substantially flat outer surface opposite said first face.

3. The device of claim 2 wherein said second thickness is 0.5 to 3 mils (0.013 to 0.076 mm).

4. The device of claim 3 wherein said second thickness is 1.0 to 2.0 mils (0.025 to 0.051 mm).

5. The device of claim 2 or 3 or 4 wherein said solder means has a tensile strength greater than 1250 psi (8.6 MPa).

6. The device of claim 5 wherein said solder means has a melt temperature in the range 306°–314° C.

7. The device of claim 5 wherein said first and second contact members are substantially identical.

8. The device of claim 5 wherein said semiconductor die is a Schottky diode.

9. The device of claim 5 wherein said solder means comprises a solder material of lead and tin alloy of composition in the range Pb (90%)/Sn (10%) to Pb (100%)/Sn (0%).

* * * * *